United States Patent
Lai (10) Patent No.: US 7,175,449 B2
(45) Date of Patent: Feb. 13, 2007

(54) INTEGRATED CIRCUIT CONNECTOR FOR LGA PACKAGE

(76) Inventor: Kuang-Chih Lai, No. 2, Lane 10, Shengli St., Tucheng City, Taipei County 236 (TW)

( * ) Notice: Subject to any disclaimer, the term of this patent is extended or adjusted under 35 U.S.C. 154(b) by 0 days.

(21) Appl. No.: 11/244,382

(22) Filed: Oct. 6, 2005

(65) Prior Publication Data

US 2006/0079104 A1    Apr. 13, 2006

(30) Foreign Application Priority Data

Oct. 7, 2004    (TW) .............................. 93130392 A (51) Int. Cl.
*H01R 13/44* (2006.01)
(52) U.S. Cl. ..................................... 439/140
(58) Field of Classification Search ................ 439/140, 439/141, 331, 73
See application file for complete search history.

(56) References Cited

U.S. PATENT DOCUMENTS

| | | | | |
|---|---|---|---|---|
| 5,534,787 A | * | 7/1996 | Levy ........................ | 324/761 |
| 5,713,744 A | * | 2/1998 | Laub ........................... | 439/71 |
| 5,932,891 A | * | 8/1999 | Higashi et al. ............... | 257/48 |
| 6,743,043 B2 | * | 6/2004 | Yamada ....................... | 439/482 |

* cited by examiner

*Primary Examiner*—Phuong Dinh
(74) *Attorney, Agent, or Firm*—Birch, Stewart, Kolasch & Birch, LLP (57) ABSTRACT

An integrated circuit connector for LGA package is used to fix a support assembly and a back assembly to circuit board. An integrated circuit is mounted in the support assembly and corresponding to the circuit board. The support assembly comprises protection board and contact stage and the contact stage comprises contact holes for containing contacts. The protection board includes a plurality of through holes corresponding to the contact holes such that the contacts are movable in the through holes. The protection board includes spring elements on both sides thereof and between the protection board and the contact stage such that the protection board is movable to protect the contact. The contact will not be deformed when the circuit board is manufactured and conveyed.

14 Claims, 15 Drawing Sheets

INTEGRATED CIRCUIT CONNECTOR FOR LGA PACKAGE

BACKGROUND OF THE INVENTION

1. Field of the Invention

The present invention relates to an integrated circuit connector for LGA package, especially to an integrated circuit connector for LGA package, which has enhanced resistance for horizontal pressure and can prevent contact deform during manufacture and convey of contacts.

2. Description of Prior Art

Integrated circuits (IC) are heart of computer. It is cumbersome for replacing or updating IC when IC is soldered on circuit board for use. Therefore, IC is generally mounted on a socket for providing electrical connection to underlying circuit board. The IC can be easily replaced or updated without the risk of damaging circuit board. Alternatively, a PGA package can be used, wherein the IC comprises a plurality of male contacts on bottom thereof and the IC socket comprises a plurality of U-shaped female contact for mating the male contacts.

Figure 1:
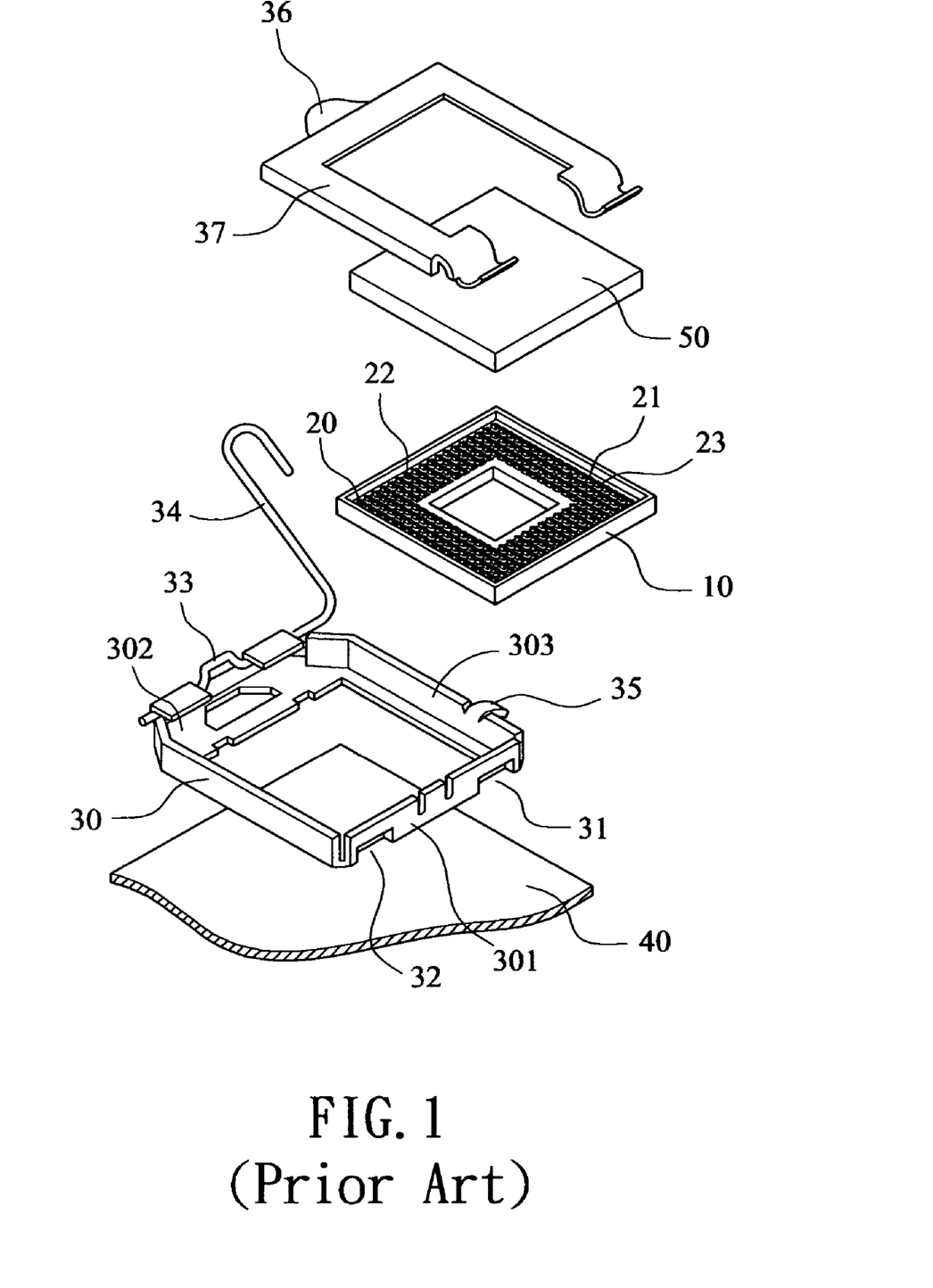
FIG. 1 shows a prior art LGA (Land Grid Array) package socket.

FIG. 1 shows a conventional LGA (Land Grid Array) package socket. The LGA socket 10 comprises contacts 20, 21, 22, 23 electrically connected to IC 50 and circuit board 40. The contacts 20, 21, 22, 23 are soldered with tin paste on tail thereof to solder the contacts 20, 21, 22, 23 to the circuit board 40. The LGA socket 10 is placed in a clamping frame 30. The clamping frame 30 comprises locking holes 31, 32 on a first side 301 thereof and used for locking a clip 37. The clamping frame 30 further comprises a handle 34 with a crank 33 on a second side 302 thereof, and the clip 37 comprises a tongue 36 corresponding to the crank 33. The clamping frame 30 further comprises a hook 35 corresponding to the handle 34 on a third side thereof. After the IC 50 is placed on the LGA socket 10, the clip 37 is placed upon the IC 50 to initially retain the IC 50. Afterward, the handle 34 is pressed against the hook 35 and the crank 33 is engaged with the tongue 36. Therefore the IC 50 is pressed down firmly such that the contacts thereof are forced to touch the LGA socket 10. However, the above-mentioned socket has following drawbacks.

1. The contacts are tiny and exposed; therefore the contacts have risk of damaging during assembling.

2. The circuit board is subject to single-direction force and not supported on backside thereof. The circuit board tends to deformation to cause poor contact between contacts and circuit board.

3. The operation of clip and handle needs both hands of user; this is cumbersome.

SUMMARY OF THE INVENTION

The present invention is to provide an integrated circuit connector for LGA package. A protection board is assembled to a contact stage and the protection board comprises a plurality of through holes. The protection board is movably arranged on the contact stage and the contact stage comprises a plurality of contact holes. Each contact hole contains a contact therein such that the contact is guided by the through hole when the contact extends out of the contact hole. A plurality of spring elements is provided between the protection board and the contact stage. When the IC is not assembled, the contact is not exposed and not deformed. The contact can be protected by the protection board during assembling and conveying.

Preferably, the integrated circuit connector according to the present invention comprises a support assembly and a back assembly to fix the support assembly on the circuit board. The support assembly comprises a clamping frame, at least one protection board and a contact stage. The protection board and the contact stage can be mounted in the clamping frame. The back assembly comprises a reinforce board. The support assembly and the back assembly are fixed to circuit board by screw. Alternatively, the back assembly is soldered to the back face of the circuit board, or the support assembly is directly soldered to the front face of the circuit board.

In one aspect of the present invention, the reinforce board comprises a plurality of tongues to provide a back side pressure for the circuit board and counter act the forward pressure of the IC on the circuit board. The circuit board can be prevented from concave deformation and stable contact can be preserved.

In another aspect of the present invention, the handle thereof can be operated by single hand to link the pressing cap. The IC, protection board and contact stage can be clamped and the contact can be pressed with suitable pressure. Moreover, the handle can be operated by single hand to detach from hook, the IC, protection board and contact stage can be removed easily.

In another aspect of the present invention, during the operation of the handle, the head and tail of the contact will remove dirt and oxide on IC or circuit board by swing over them.

In still another aspect of the present invention, the head and tail of the contact have good contact with the IC or circuit board to save the step of soldering.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 2:
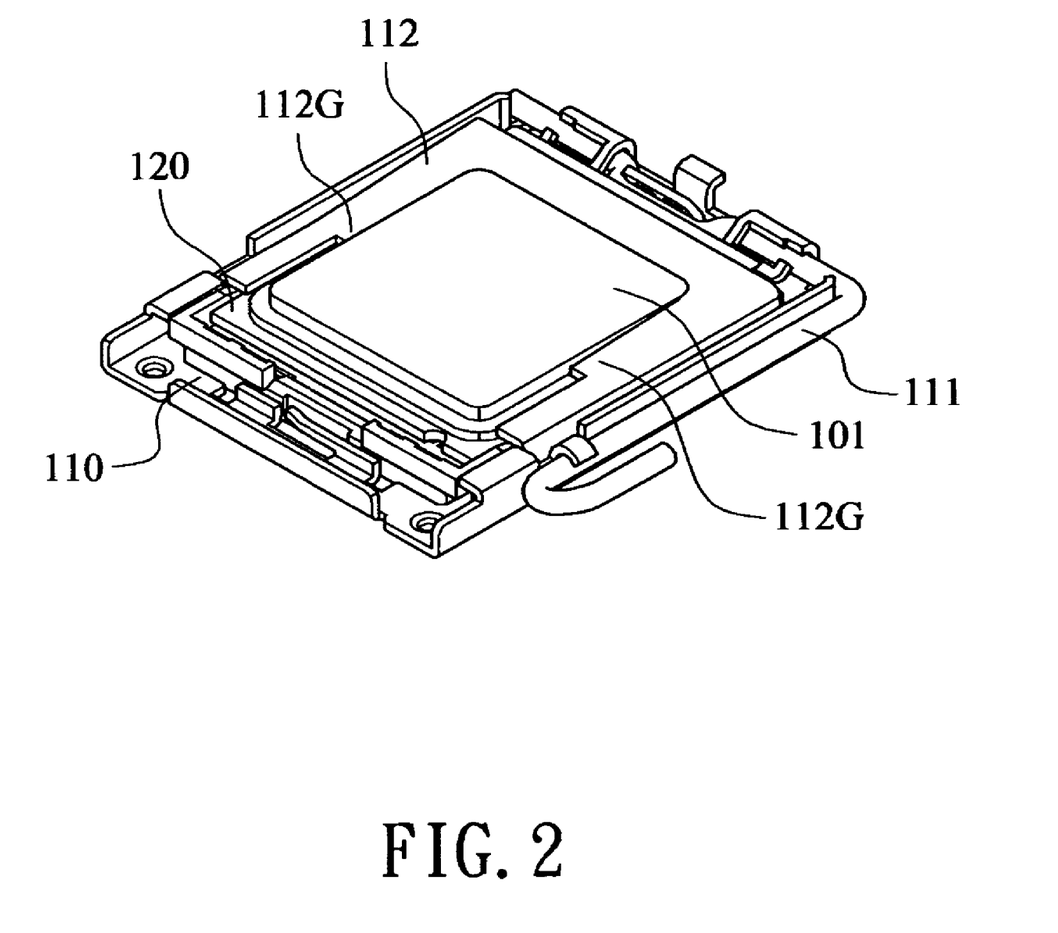
FIG. 2 shows the perspective view of the LGA connector according to the present invention.
Figure 3:
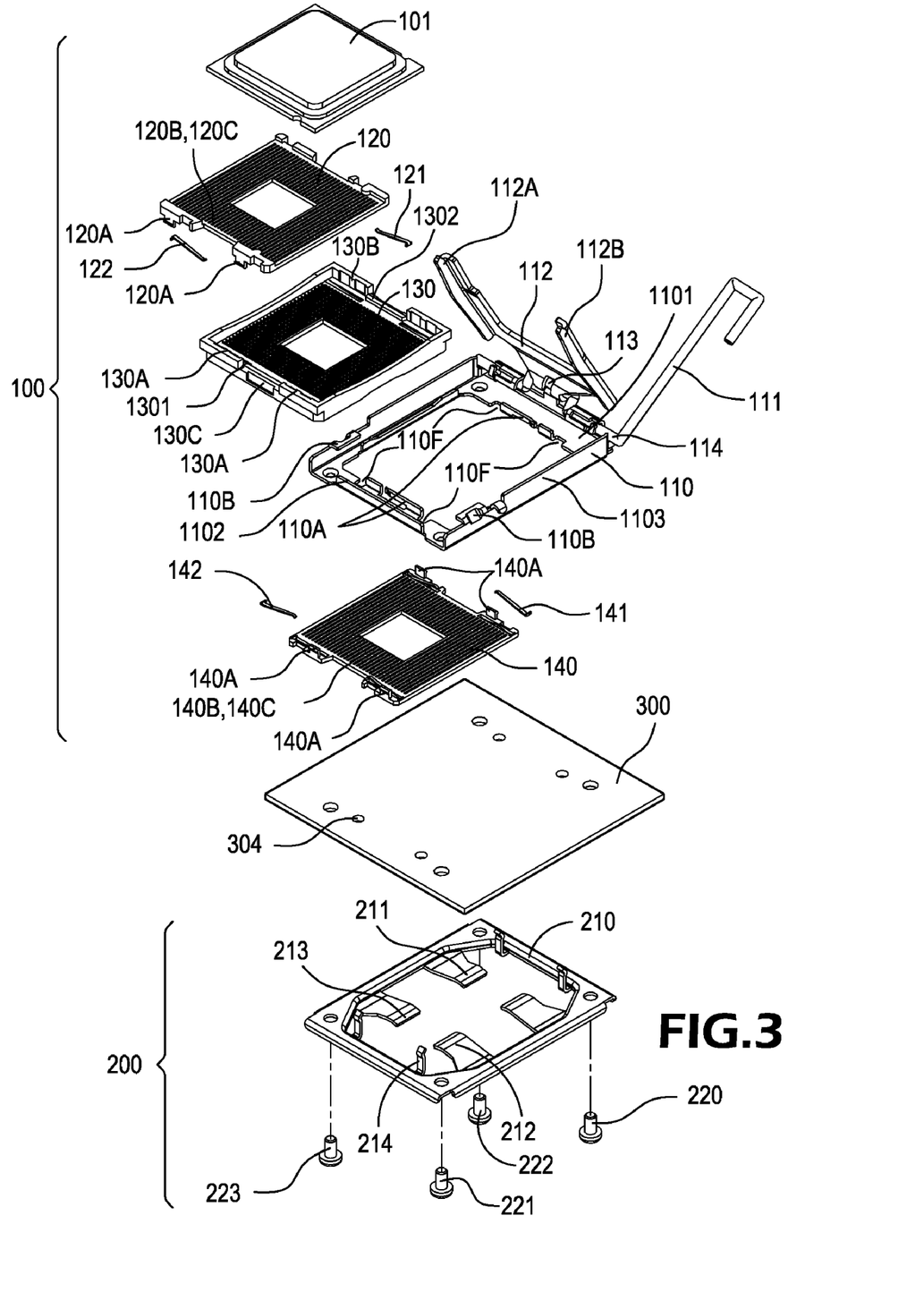
FIG. 3 shows the exploded view of the LGA connector according to the present invention.
Figure 4:
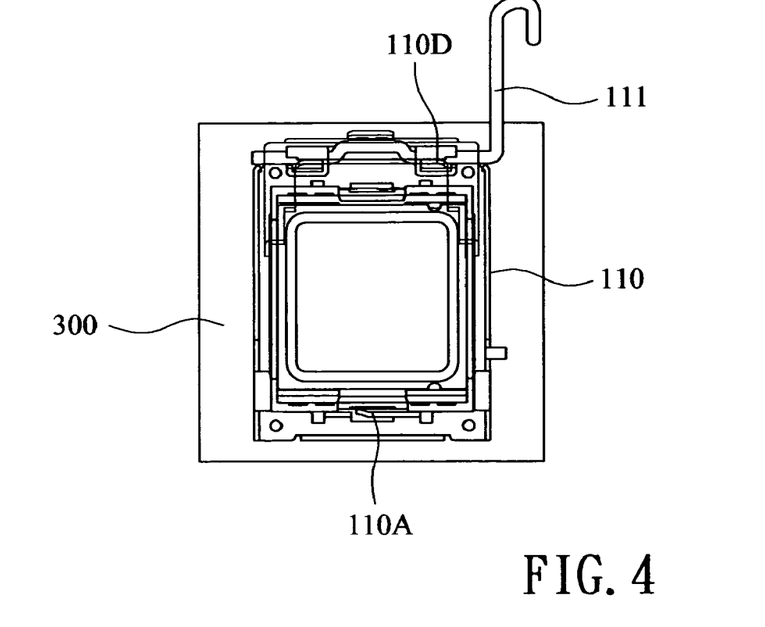
FIG. 4 shows the top view of the LGA connector according to the present invention.

With reference to FIGS. 2 and 3, the LGA connector according to the present invention comprises a support assembly 100 and a back assembly 200 which can fix the support assembly 100 to a circuit board 300. The support assembly 100 comprises a locking frame 110, at least one protective board 120, 140 and a contact stage 130. The protective board 120, 140 and the contact stage 130 are mounted in the locking frame 110 after assembling. The back assembly 200 comprises a reinforce board 210 and uses screws 220, 221, 222 and 223 to fix the support assembly 100 to the circuit board 300, wherein an IC 101 is mounted in the support assembly 100.

Figure 6:
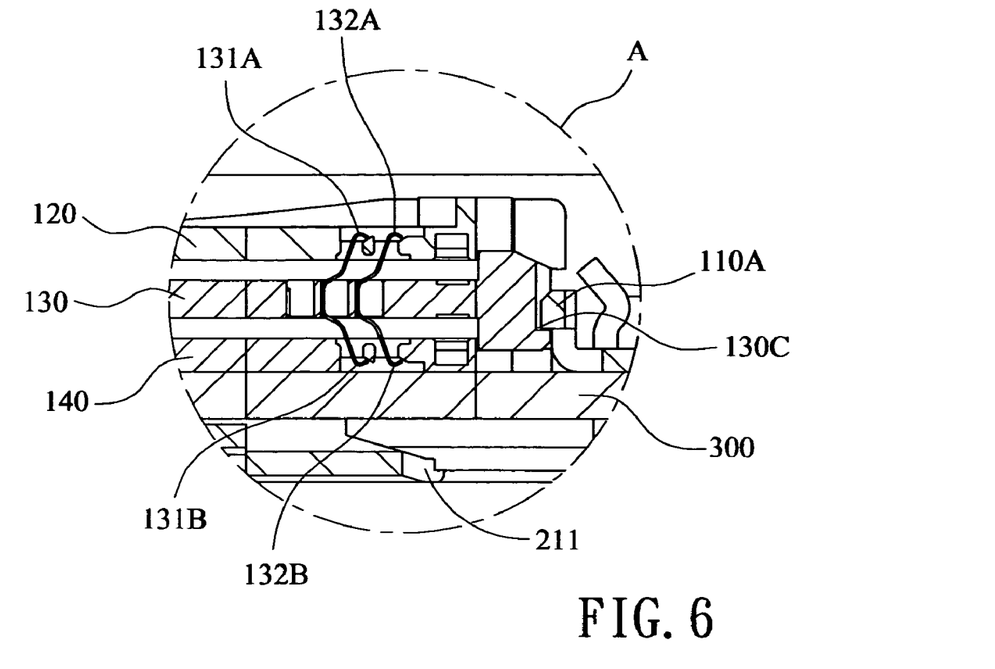
FIG. 6 shows a partially enlarged view of area A in FIG. 11.

The locking frame 110 comprises a first side 1101, a second side 1102 and a third side 1103. A handle 111 and a pressing cap 112 are pivotally provided on the first side 1101. The locking frame 110 contains the contact stage 130 therein such that the pressing cap 112 presses against the contact stage 130. As shown in FIG. 6, the contact stage 130 comprises a first wall 1301 and a second wall 1302 vertical to each other. The first wall 1301 comprises a clamping groove 130C and a spring plate 110A on the second side 1102 is engaged into the clamping groove 130C to floatingly clamp the contact stage 130 into the locking frame 110. To eject the contact stage 130, the spring plate 110A is pulled out to detach the clamping groove 130C from the spring plate 110A, thus ejecting the contact stage 130.

The reinforce board 210 comprises a plurality of pre-load tongues 214 around the peripheral thereof. The locking frame 110 comprises mouths 110F corresponding to the pre-load tongues 214. When the locking frame 110 and the reinforce board 210 are locked into the circuit board 300, the pre-load tongues 214 pass through holes 304 on the circuit board 300 and are then locked to the mouths 110F. Therefore, the locking frame 110 and the reinforce board 210 are initially locked to the circuit board 300 and then fixed by screws. The locking frame 110 comprises a plurality of locking holes 1104 for the locking of the screws 220, 221, 222 and 223. Moreover, the locking hole 1104 comprises a downward flange with thread therein; the downward flange penetrates into hole 305 of the motherboard.

Figure 7:
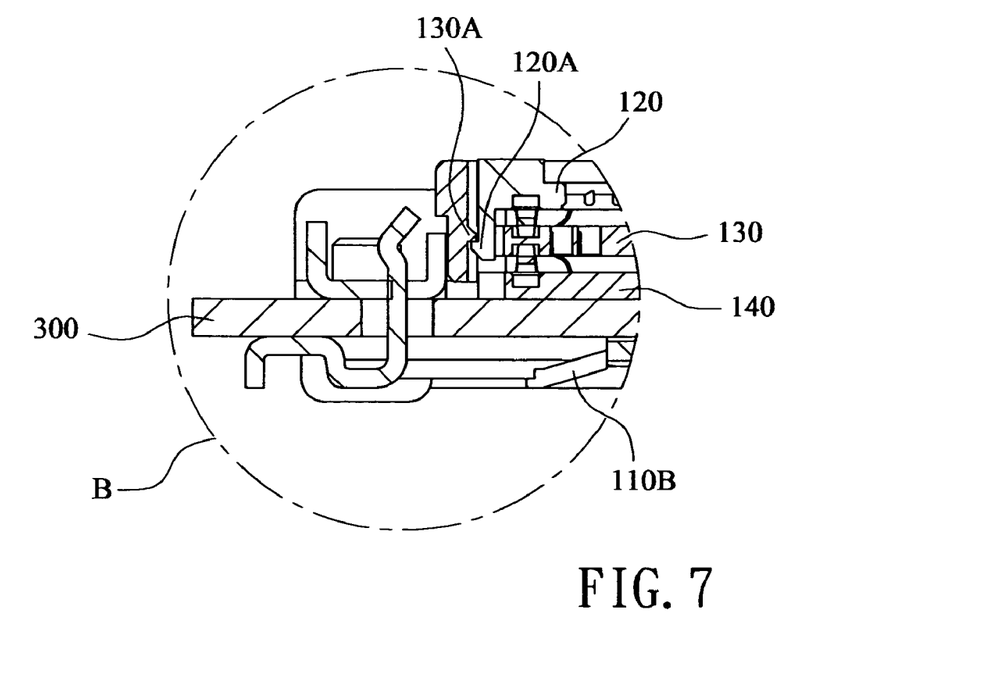
FIG. 7 shows a partially enlarged view of area B in FIG. 11.

FIG. 7 shows a partially enlarged view of the LGA connector according to the present invention. The protective boards 120, 140 comprises locking male hooks 120A, 140A and the first wall 1301 and the second wall 1302 of the contact stage 130 comprises a pair of female walls 130A, 130B corresponding to the male hooks 120A, 140A. The protective boards 120, 140 have floating stroke in the contact stage 130 when the male hooks 120A, 140A are engage with the female walls 130A, 130B.

Figure 11:
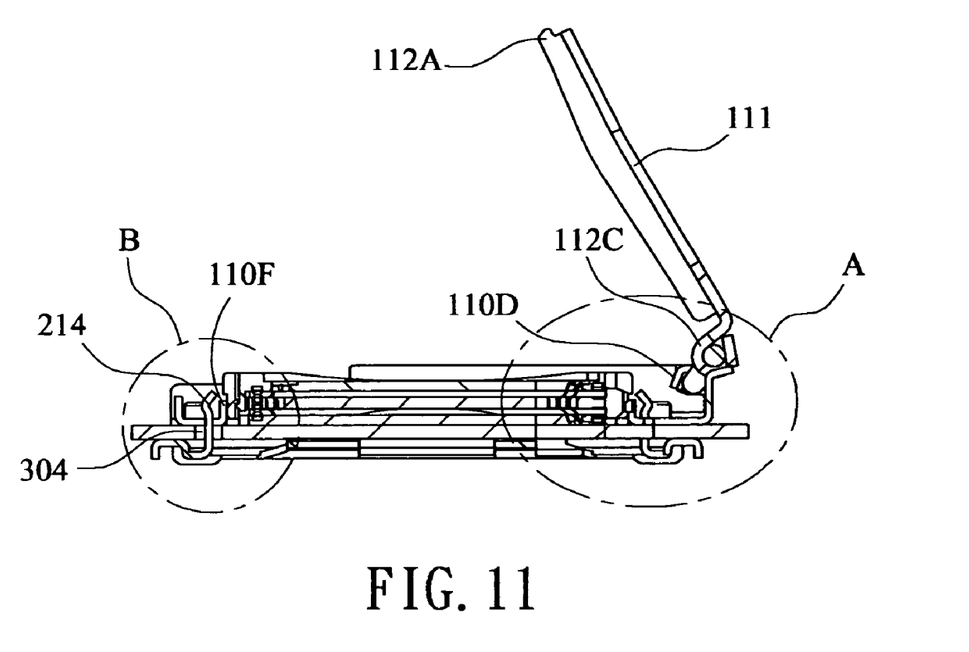
FIG. 11 shows the sectional view of the LGA connector before pressing according to the present invention.
Figure 12:
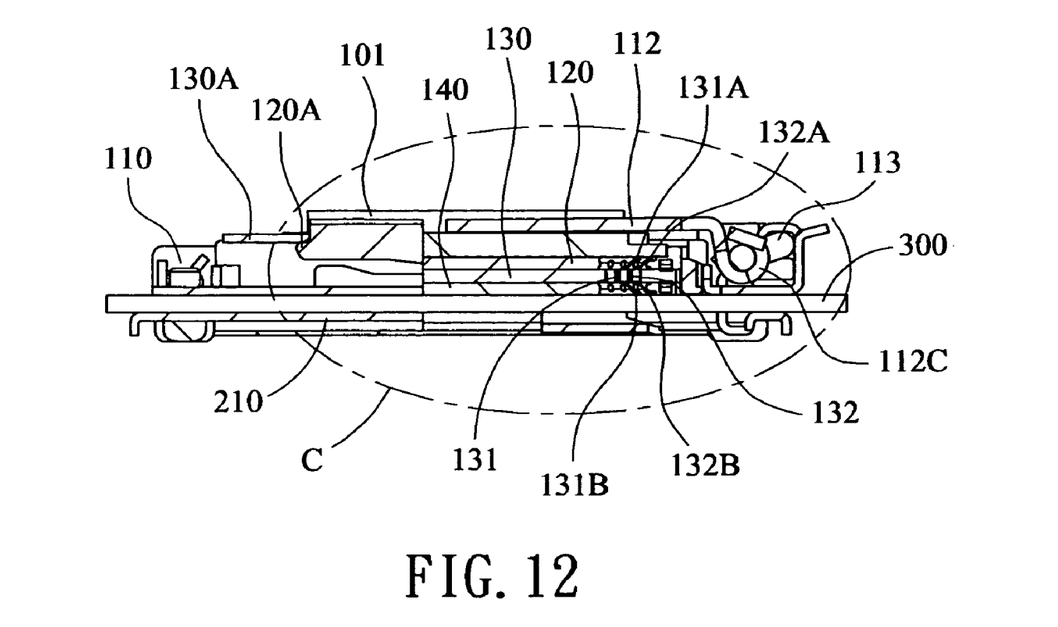
FIG. 12 shows the sectional view of the LGA connector after closing state according to the present invention.
Figure 13:
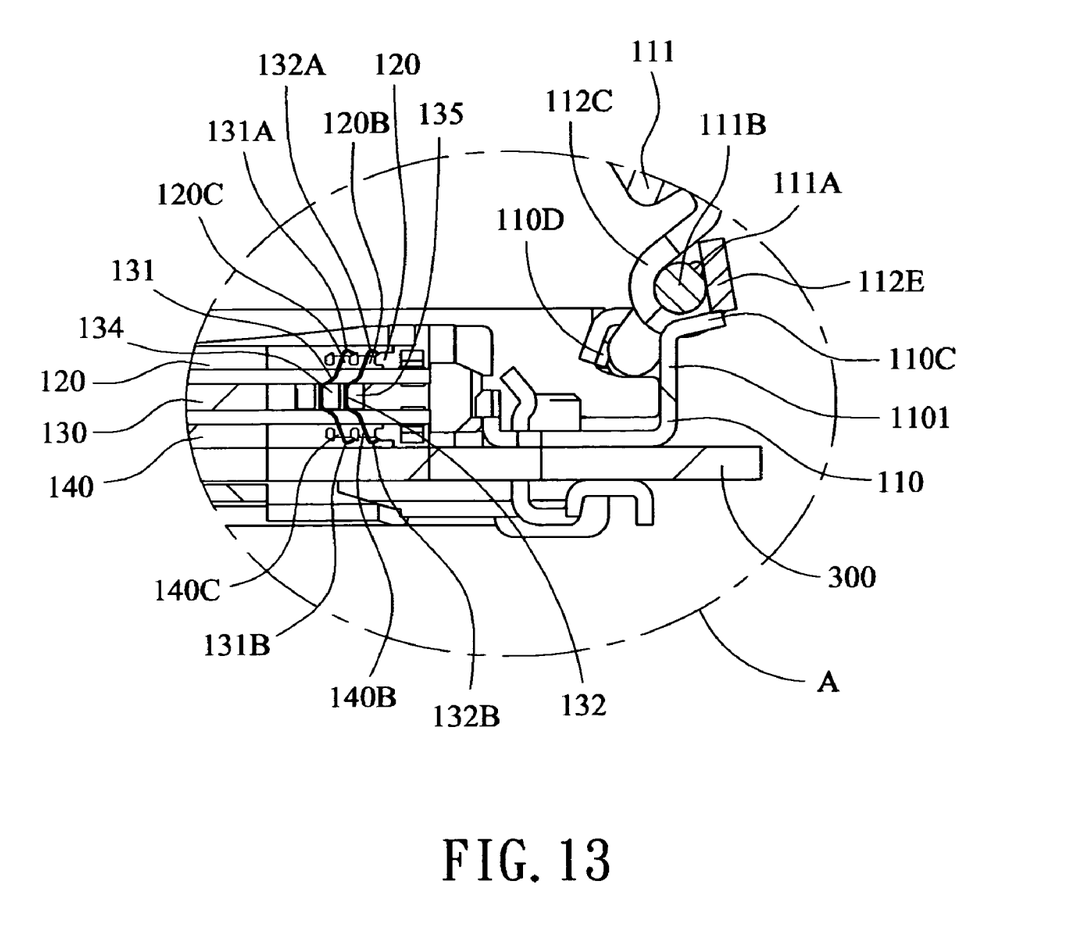
FIG. 13 shows a partially enlarged view of area B in FIG. 11.

With reference to FIGS. 11, 12 and 13, the contacts 131, 132 in the contact holes 134, 135 of the contact stage 130 are in contact with the IC 101. The heads 131A, 132A and tails 131B, 132B of the contacts 131, 132 extends out of the contact holes 134, 135 of the contact stage 130 to penetrate the through holes 120B, 120C, 140B, 140C of the protective boards 120, 140. When the protective boards 120, 140 are subject to pressure, the heads 131A, 132A and tails 131B, 132B of the contacts 131, 132 extends out of the through holes 120B, 120C, 140B, 140C of the protective boards 120, 140 and are in contact with the IC 101. When the handle 111 is pulled, the heads 131A, 132A and tails 131B, 132B of the contacts 131, 132 will scratch the circuit board 300 or IC 101 to remove dirt or oxide layer thereon. Moreover, the heads 131A, 132A and tails 131B, 132B of the contacts 131, 132 provide dual contact for contacting the circuit board 300 or IC 101. Therefore, soldering is not necessary and the contacts 131, 132 can be removed for repeated use.

Figure 5:
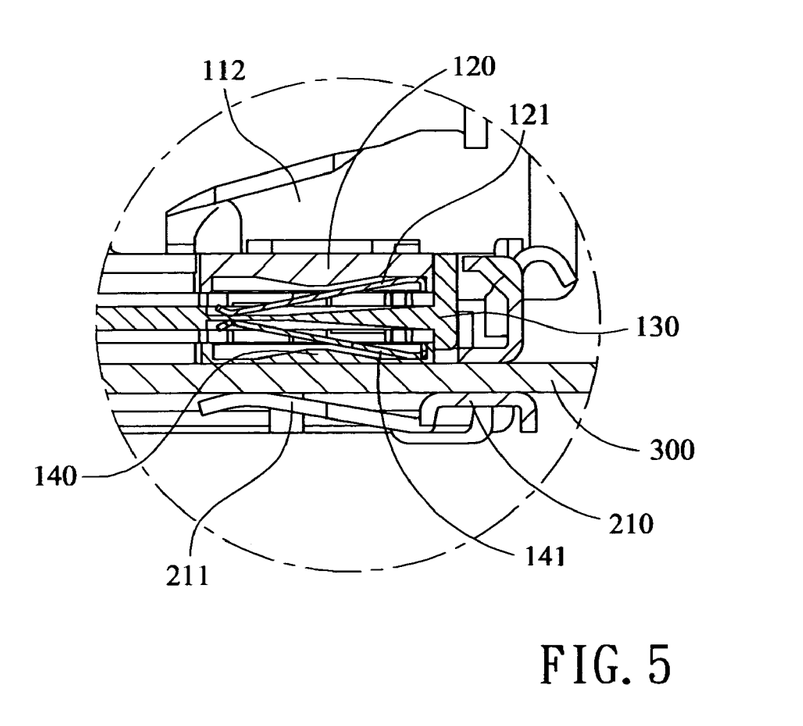
FIG. 5 shows a partially enlarged view along line V in FIG. 4.
Figure 9:
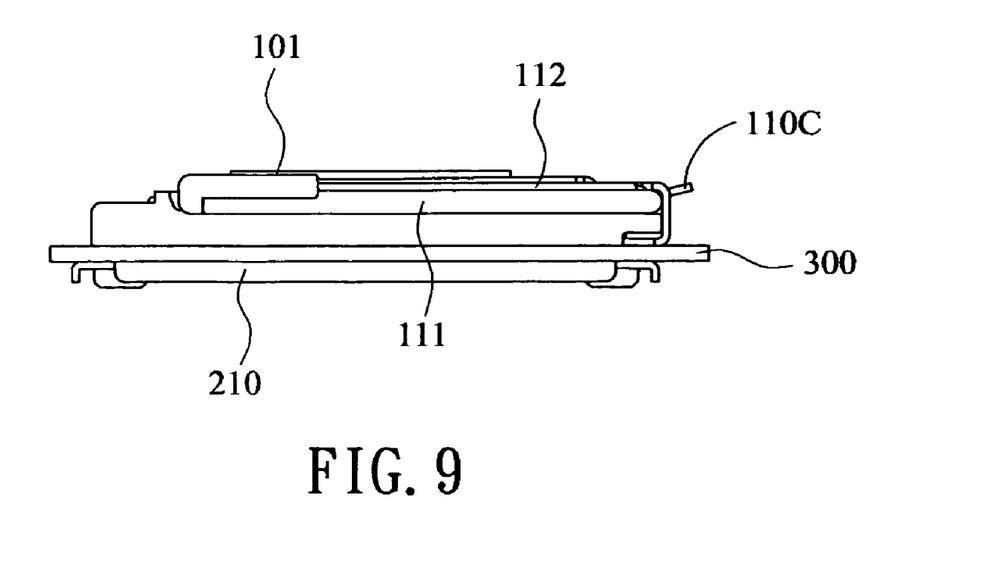
FIG. 9 shows the sectional view of the LGA connector in closing state according to the present invention.

FIG. 5 shows a partially enlarged view of the floating section, wherein a plurality of spring elements 121, 122, 141, 142 are employed to provide spring movement between the protective boards 120, 140 and the contact stage 130. With reference to FIGS. 6 and 12, the surface of the protective board 120 is higher than the heads 131A, 132A and tails 131B, 132B of the contacts 131, 132. With reference to FIGS. 9 and 12, when the IC 101 is pressed and the protective boards 120, 140 are moved toward the contact stage 130, the contacts 131, 132 projects out of the through holes 120B, 120C, 140B, 140C of the protective boards 120, 140. Therefore, the heads 131A, 132A and tails 13 1B, 132B of the contacts 131, 132 have swinging contact with respect to the circuit board 300 or IC 101 and can scratch the circuit board 300 or IC 101 to remove dirt or oxide layer thereon.

Figure 8:
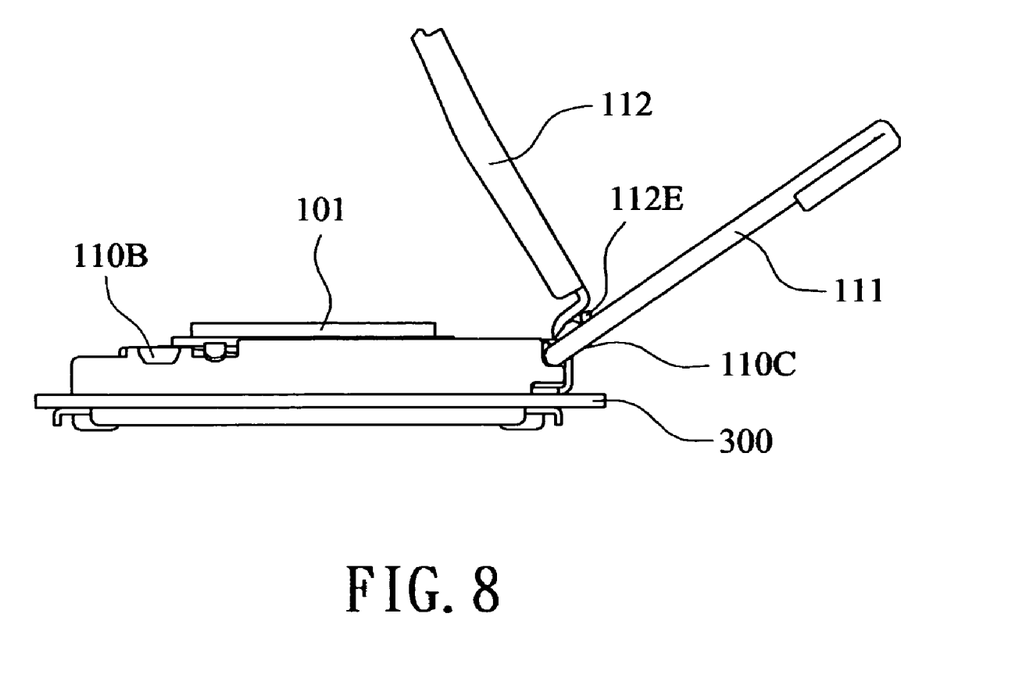
FIG. 8 shows the sectional view of the LGA connector in opening state according to the present invention.

FIG. 8 shows a sectional view for opening the LGA connector according to the present invention. The pressing cap 112 of the locking frame 110 is linked with the handle 111. The handle 111 can be operated to press downward the pressing cap 112 of the locking frame 110 and to clamp the IC 101.

Figure 14:
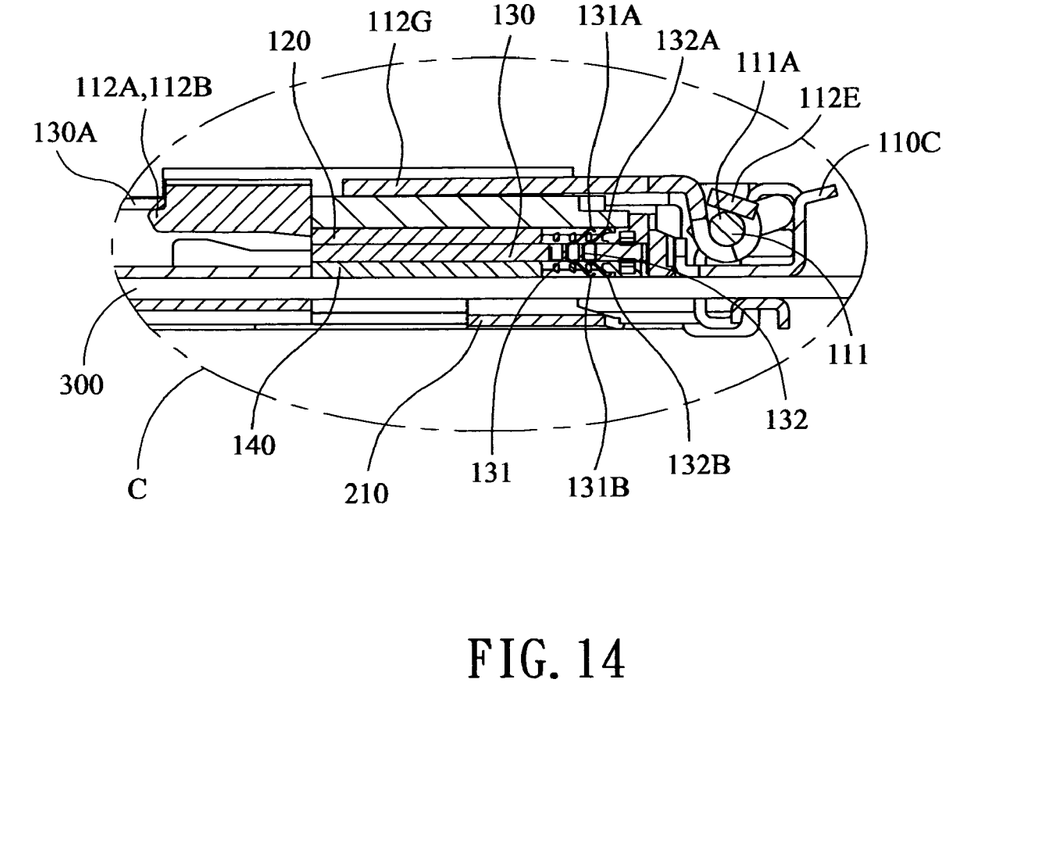
FIG. 14 shows a partially enlarged view of area C in FIG. 12.

FIGS. 12 and 14 are sectional view for closing the LGA connector according to the present invention. After the IC 101 is clamped, the handle 111 is operated download to lock the IC 101. At this time, the LGA connector is back to the situation as shown in FIGS. 5, 8 and 13, the IC 101 can be easily mounted or removed. FIG. 3 shows an exploded view of the present invention, a plurality of tongues 211, 212, 213 are provided on bottom of the reinforce board 210 to reduce pressure of the support assembly 100 acting against the circuit board 300 and to prevent concave deform of the circuit board 300.

Figure 10:
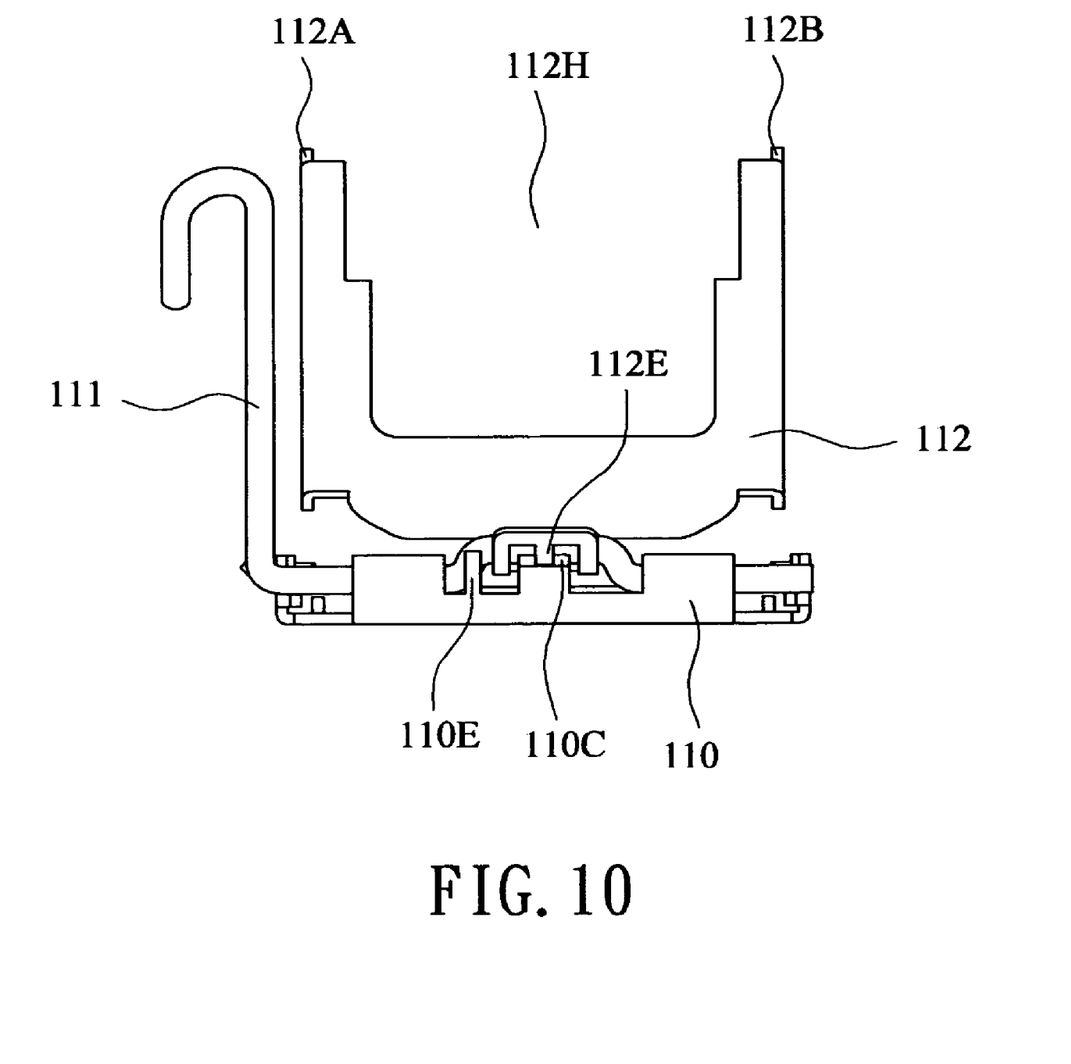
FIG. 10 shows the back view of the LGA connector before pressing according to the present invention.

With reference to FIGS. 10, 11, and 13 the linking of the pressing cap 112 of the locking frame 110 with the handle 111 is shown in more detail. A crank 111B is formed at center of the handle 111 and a pivotal pipe 112C on one side of the pressing cap 112 of the locking frame 110 is pivotally locked to the crank 111B. A rotation axis is provided on each side of the crank 111B for pivotally connecting to the locking frame 110. The first side 1101 of the locking frame 110 comprises pressing tab 110D for pressing against the rotation axis. The crank 111B comprises an auxiliary bump 111A and the locking frame 110 comprises a baffle 110C near the handle 111. When the handle 111 is pulled upward and the pressing cap 112 is rotated, the crank 111B is abutted against an abutting block 110E of the locking frame 110. The tail wall 112E of the pressing cap 112 is also abutted against the baffle 110C such that the pressing cap 112 and the handle 111 are kept to an opening angle. The handle 111 and the pressing cap 112 will not loosen. The pressing cap 112 of the locking frame 110 comprises an opening 112H for facilitating the assembling of the IC 101, wherein the IC 101 can be directly assembled through the opening 112H.

As shown in FIGS. 12 and 14, the pressing cap 112 of the locking frame 110 is rotated when the handle 111 is rotated. The pressing cap 112 of the locking frame 110 has a force-acing point 112G against the IC 101 and the crank 111B is moved forward and downward such that the arms 112A and 112B of the pressing cap 112 extend to bottom side of a locking board 110B on both sidewalls of the locking frame 110. The crank 111B is further pushed downward and the force-acing point 112G is moved further to press against the IC 101. The protective boards 120 and 140, the contact stage 130 and the circuit board are moved to clamping point for locking. Moreover, a chamfer for insertion of the arms 112A, 112B is formed on front end of the locking board 110B.

To open the support assembly 100 and to remove the IC 101, the handle 111 is pulled to release pressure on the force-acing point 112G. The handle 111 is rotated further to release the arms 112A and 112B from the locking board 110B, and the pressing cap 112 of the locking frame 110 is also linked to rotate and the state shown in FIG. 8 is restored. The protective boards 120 and 140 are floated by the spring elements 121, 122, 141, 142 to protect the contacts 131 and 132 during opening state. During usage, the locking frame 110 and the reinforce board 210 are fixed to the circuit board 300 by screws 220 221, 222 and 223, thus finishing the assembling.

Figure 15:
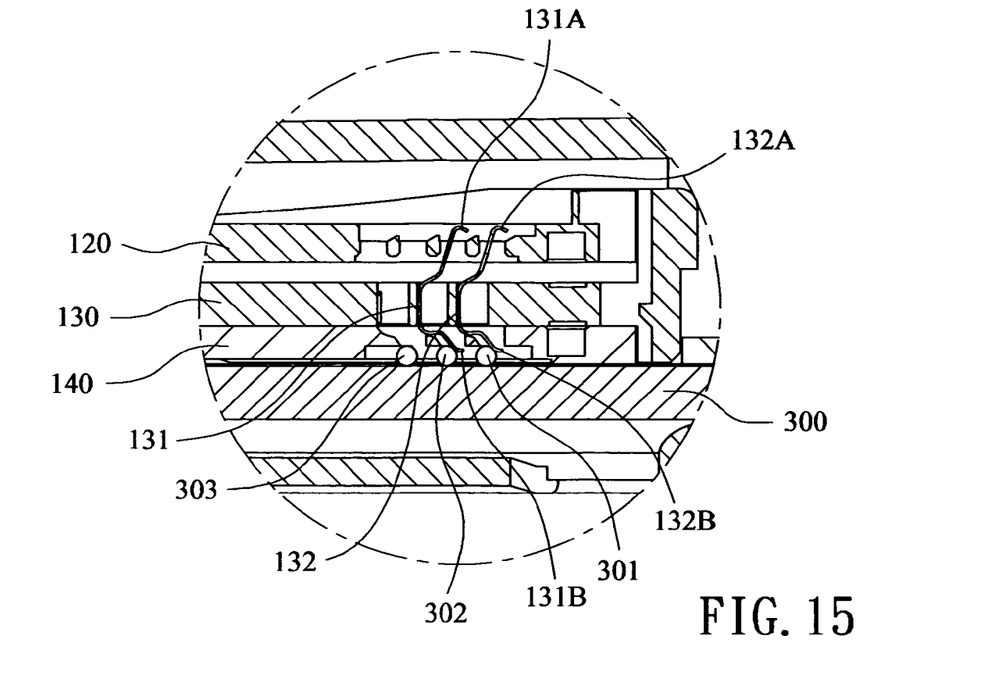
FIG. 15 shows another partially enlarged view of area B in FIG. 11.
Figure 16:
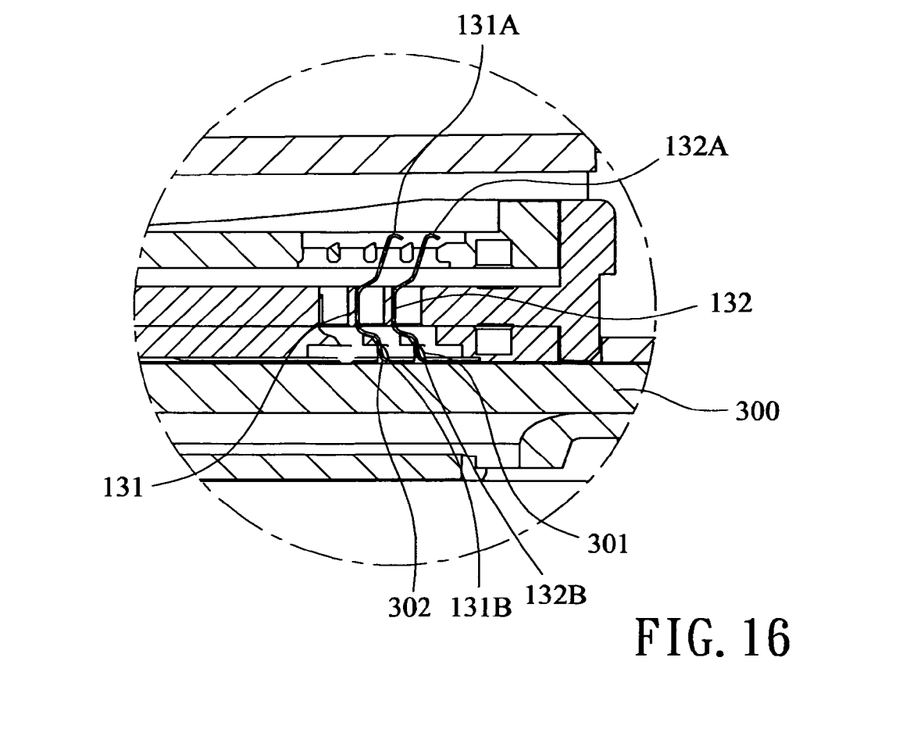
FIG. 16 shows another partially enlarged view of area C in FIG. 12.

As shown in FIGS. 15 and 16, the contact stage 130 comprises a protective board 120 on top side thereof and does not comprise protective board on bottom side thereof. The solder ball 301, 302 or 303 at tail of the contact is heated to melt on the circuit board 300.

Figure 17:
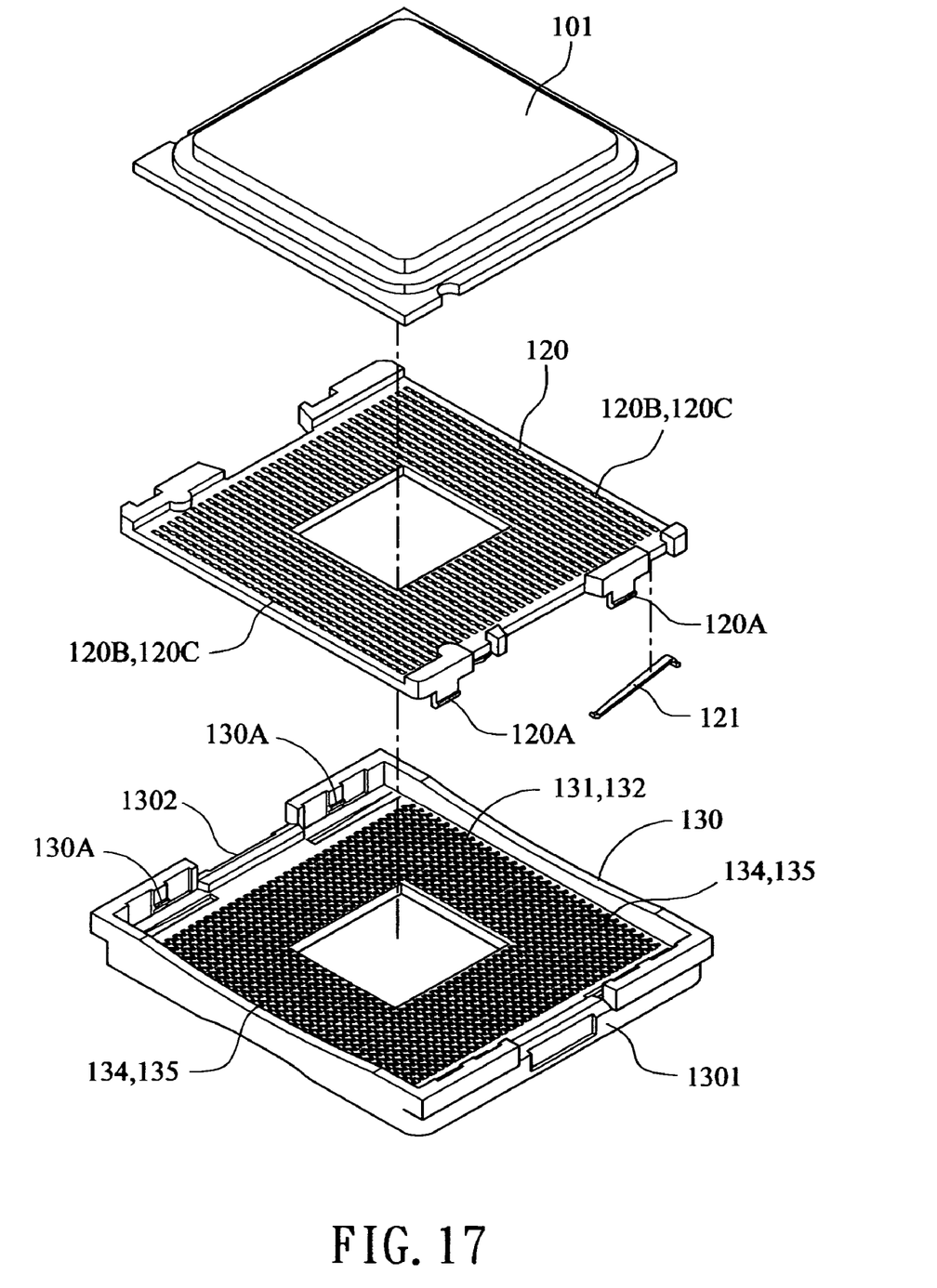
FIG. 17 shows the exploded view of the protection board and the contact stage of the LGA connector according to the present invention.
Figure 18:
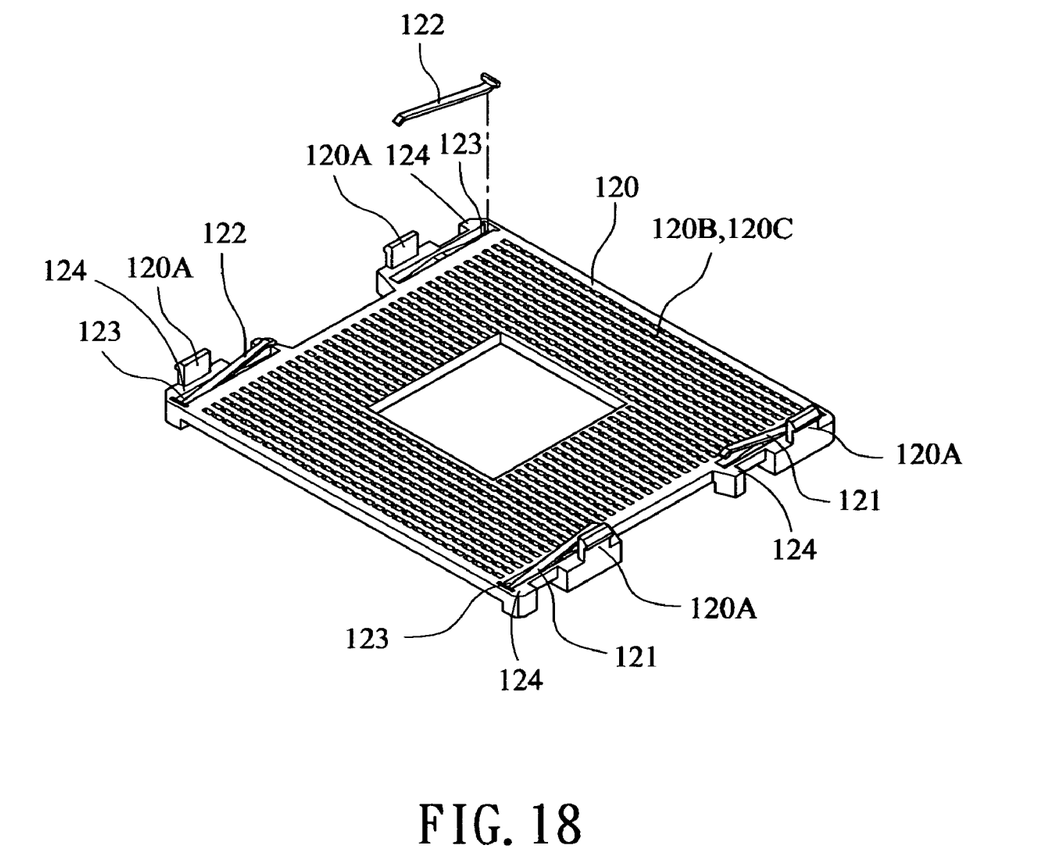
FIG. 18 shows the schematic view of the protection board of the LGA connector according to the present invention.

With reference to FIGS. 17 and 18, the contact stage 130 comprises a protective board 120 on topside thereof and a plurality of spring elements 121, 122 are provided between the contact stage 130 and the protective board 120 such that the protective board 120 floats on the contact stage 130. The protective board 120 prevents the contacts 131, 132 from deforming. The protective board 120 further comprises a plurality of through holes 120B and 120C and the contact stage 130 comprises a plurality of contact holes 134 and 135. Each of the contact holes 134 and 135 comprises a contact 131, 132 such that the contact 131, 132 can be protected in the through holes 120B and 120C when the contact 131, 132 extend out of the contact holes 134 and 135. As shown in FIGS. 7 and 17, both ends of the protective board 120 comprise a pair of lips 120A; the first wall 1301 and the second wall 1302 of the contact stage 130 comprise a pair of female locking walls 130A corresponding to the lips 120A. The protective board 120 floats on the contact stage 130 when the lips 120A are engaged with the female locking walls 130A.

With reference to FIG. 18, the protective board 120 comprises four trenches 123 located at four ears 124 of the protective board 120. One end of the spring elements 121, 122 is located in one end of the trench 123 and another end of the spring elements 121, 122 is dangled. When the protective board 120 is pressed by the IC 101 and approaches the contact stage 130, the dangled end of the spring elements 121, 122 is pressed by the contact stage 130 and fit into the trench. When the IC 101 is removed and the protective board 120 is not subject to pressure, the dangled end of the spring elements 121, 122 will leave the trench 123 due to pressure and be away from the contact stage 130 due to a counter action force of the contact stage 130.

Figure 19:
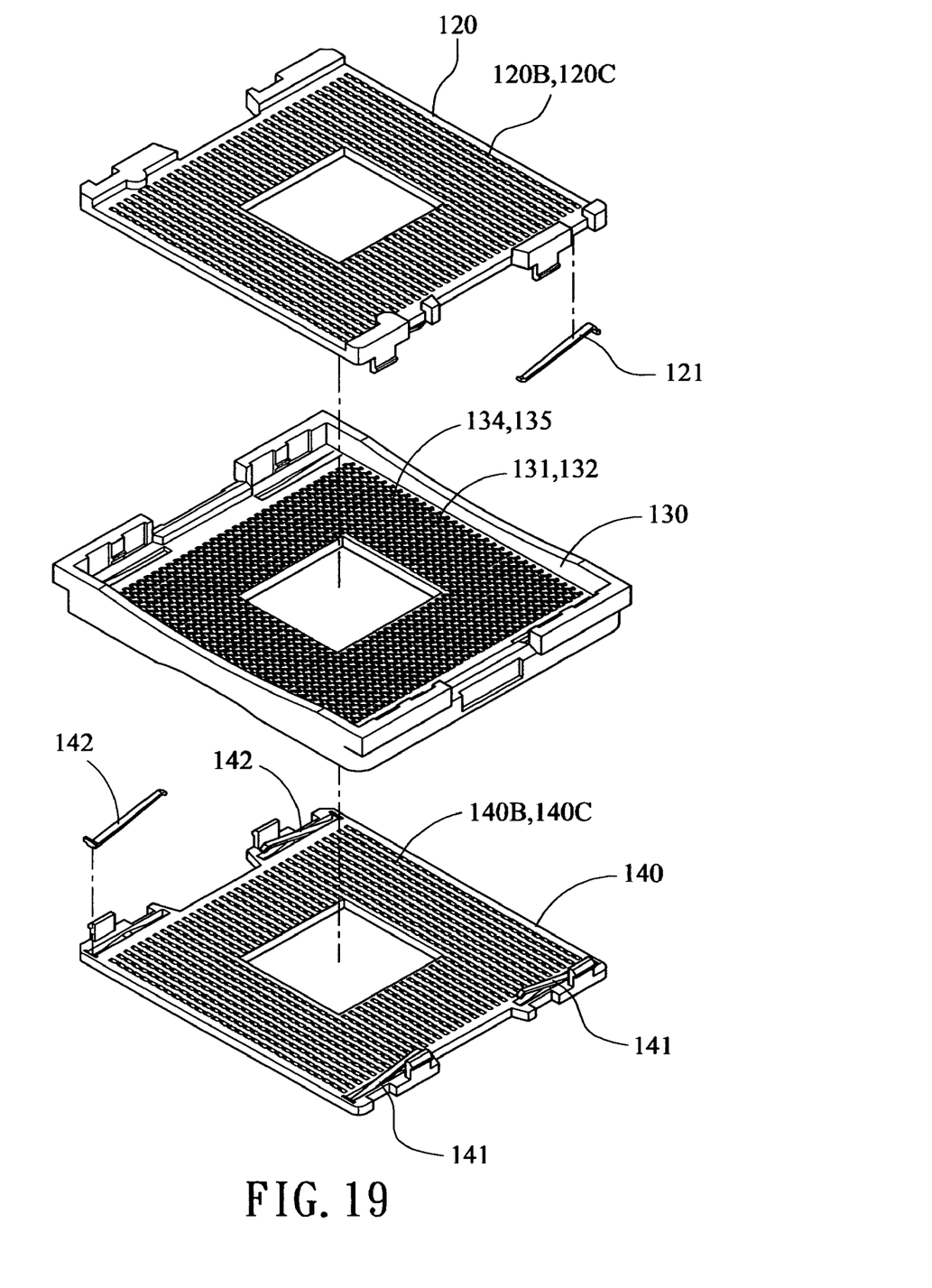
FIG. 19 shows the schematic view of the protection board and the contact stage of the LGA connector according to another preferred embodiment of the present invention.

As shown in FIG. 19, the contact stage 130 is provided with protective boards 120 and 140 on top side and bottom side thereof, respectively. In other word, the contact stage 130 is provided with protective boards 120 and 140 on top side or bottom side or both top and bottom sides thereof. The protective boards 120 and 140 comprises a plurality of through holes 120B, 120C, 140B, 140C and the protective boards 120 and 140 are movably arranged atop the contact stage 130. The contact stage 130 comprises a plurality of contact holes 134 and 135 with contacts 131 and 132 therein, respectively. The contacts 131 and 132 can be protected in the through holes 120B, 120C, 140B, 140C when the contacts 131 and 132 extend out of the contact holes 134 and 135. Moreover, a plurality of spring elements 121, 122, 141, 142 are provided between protective boards 120 and 140 such that the protective boards 120 and 140 have to-and-fro elastic movement on the contact stage 130.

Figure 20:
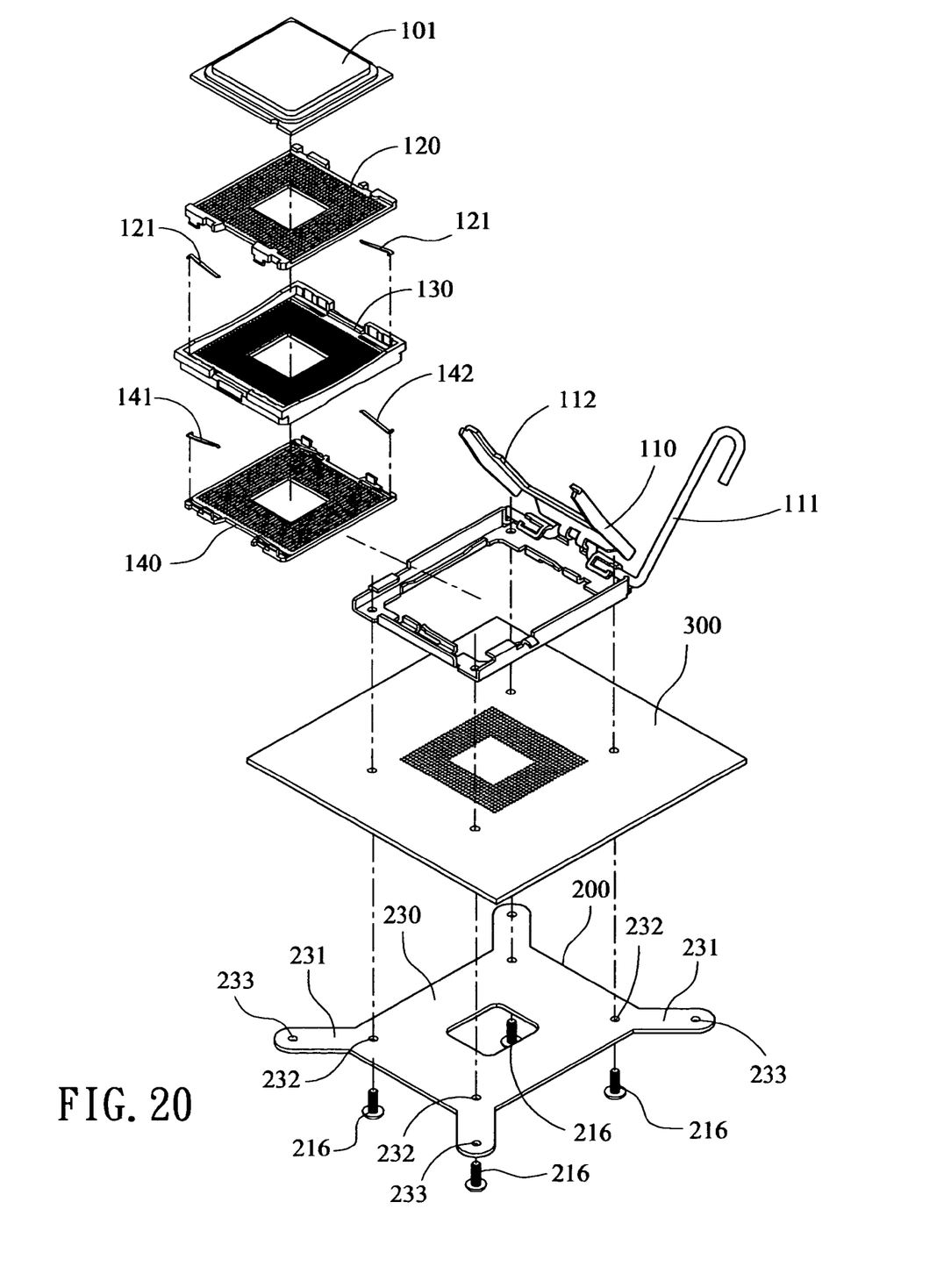
FIG. 20 shows the exploded view of the LGA connector according to another preferred embodiment of the present invention.

As shown in FIG. 20, the support assembly 100 is arranged on the circuit board 300 and screw 216 is used to fix the back assembly 200 and the locking frame 110 to the circuit board 300. The back assembly 200 is an apertured panel 230 with a plurality of extended arms 231 extruding on peripheral of the apertured panel 230. Each of the extended arms 231 comprises a threaded hole such that heat-dissipating fins can be fixed atop the IC 101 by bolts. The panel 230 enhances pressure resisting ability of the circuit board 300 with respect to the IC 101 and prevents the concave deform of the circuit board 300, thus keeping stable contact and structure integrity. The panel 230 comprises a plurality of holes 232 through which screws 220, 221, 222, 223 pass for locking with a fixing hole 1104. As can be seen from above preferred embodiment, the back assembly 200 and the locking frame 110 can be fixed by screwing or soldering. Alternatively, the back assembly 200 is fixed by screwing and the frame 110 is fixed by soldering, and vice versa.

The protective boards 120 and 140 are arranged on top side or bottom side of the contact stage 130 and floatingly arranged on the contact stage 130 with the help of the spring elements 121, 122, 141 and 142. The protective boards 120 and 140 and the contact stage 130 are mounted in the locking frame 110 after assembling. When the IC 101 is mounted into the locking frame 110 and the handle 111 is pressed to press the IC 101 with the pressing cap 112, the protective boards 120 and 140 can approach the contact stage 130 by pressure. To remove the IC 101, the handle 111 is pulled to release the pressing cap 112 from the IC 101 and the protective boards 120 and 140 departs from the contact stage 130 due to the elastic force of the spring elements 121, 122, 141 and 142. Therefore, the contacts can be protected by the protective boards 120 and 140 during mounting and replacing.

To sum up, the LGA connector according to the present invention employs protective boards to protect head and tail of the contact extending out of the contact stage and prevents the deformation of contacts during manufacture and convey. The circuit board is strengthened by reinforcement board to prevent deformation of circuit board. The IC can be assembled and removed by single hand. The head and tail of contact can remove dirt and oxide on IC or circuit board by swinging thereof, and eliminate soldering need, thus preventing contamination.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An integrated circuit (IC) connector, comprising:
a support assembly comprising a clamping frame, at least one protective board and a contact stage, the protection board comprising a plurality of through holes; the contact stage arranged with the protection board and comprising a plurality of contact holes corresponding to the through holes; a plurality of spring elements arranged between the protection board and the contact stage and the spring elements being arranged on two sides of the protection board; a plurality of contacts arranged in the contact holes, each of the contacts comprising a head end and a tail end to facilitate the contact to enter the through holes; and
a back assembly comprising a reinforce board, wherein the support assembly and the back assembly are fixed to a circuit board,
wherein the clamping frame is pivotally connected to a handle and a pressing cap is fit to the handle such that the contact stage, the protection board and an IC are pressed into the clamping frame by the pressing cap.

2. The integrated circuit connector as in claim 1, wherein the support assembly and the back assembly are fixed to a circuit board by a plurality of screws.

3. The integrated circuit connector as in claim 1, wherein the pressing cap comprises an opening at center thereof.

4. The integrated circuit connector as in claim 1, wherein a crank is formed at center of a rotation shaft of the handle and a pivotal pipe of the pressing cap is pivotally connected to the crank.

5. The integrated circuit connector as in claim 4, wherein the crank comprises an auxiliary bump.

6. The integrated circuit connector as in claim 4, wherein pivotal axes on both sides of the crank are pivotally connected to one side of the clamping frame such that the clamping frame can rotate with respect to the pivotal axes to exert pressing force.

7. The integrated circuit connector as in claim 6, wherein the clamping frame comprises an abutting block abutting to outer side of the crank.

8. The integrated circuit connector as in claim 1, wherein the clamping frame comprises a baffle near the handle and the pivotal pipe comprises a tail wall such that the handle links the pressing cap to the tail wall and is blocked by the baffle.

9. The integrated circuit connector as in claim 1, wherein ears extend from two sidewalls of the clamping frame and the handle links the pressing cap such that arms extend below locking boards on both sides of the clamping frame.

10. The integrated circuit connector as in claim 9, wherein the locking board comprises chamfer for facilitating insertion of the arms.

11. The integrated circuit connector as in claim 1, wherein the reinforce board comprises a plurality of tongues.

12. The integrated circuit connector as in claim 1, wherein the contact stage comprises a plurality of female wall and the protection board comprises a plurality of lips for engaging with the female walls.

13. The integrated circuit connector as in claim 1, wherein the contact stage comprises a first wall and a second wall, the first wall comprises a clamping groove and the clamping frame comprises a spring plate corresponding to the clamping groove.

14. The integrated circuit connector as in claim 1, wherein the reinforce board comprises a plurality of pre-load tongues and the clamping frame comprises a plurality of mouths corresponding to the pre-load tongues.

* * * * *